LOCKING DEVICE FOR PRINTED CIRCUIT MODULES

Filed Nov. 19, 1964 2 Sheets-Sheet 1

INVENTOR.
ORLAND E. UPTON

BY Hill, Sherman, Meroni, Gross & Simpson
ATTORNEYS

Aug. 8, 1967 O. E. UPTON 3,335,386

LOCKING DEVICE FOR PRINTED CIRCUIT MODULES

Filed Nov. 19, 1964 2 Sheets-Sheet 2

INVENTOR.
ORLAND E. UPTON

BY Hill, Sherman, Meroni, Gross & Simpson ATTORNEYS

United States Patent Office 3,335,386

Patented Aug. 8, 1967

3,335,386
LOCKING DEVICE FOR PRINTED CIRCUIT MODULES

Orland E. Upton, San Jose, Calif., assignor to Admiral Corporation, Chicago, Ill., a corporation of Delaware Filed Nov. 19, 1964, Ser. No. 412,393
3 Claims. (Cl. 339—17)

The present invention relates to printed circuit modules of the type in which a number of printed circuit boards are releasably engaged with other circuit elements to provide a compact package in which the individual printed circuit boards are readily accessible for removal.

The device of the present invention greatly facilitates insertion and removal of individual printed circuit boards for repair or replacement with other boards. The locking arrangement is such that the boards are slidably received within the unit and lock positively to the frame of the unit, thereby assuring good electrical connection between the board and the electrical receptacle into which it is plugged, as well as mechanical rigidity which prevents accidental disengagement of the board from the receptacle under conditions of substantial mechanical impact and shock. At the same time, the individual boards can be readily disengaged from the frame, when desired, by virtue of an improved camming lever arrangement.

Another feature of the present invention resides in the provision of a printed circuit board with an improved locking arrangement, and carrying jacks thereon for the insertion of test probes without interference from the locking elements. This arrangement makes it possible to employ electronic test equipment in the circuitry of the individual printed circuit boards without disengaging the boards from the frame in which they are secured.

One of the objects of the present invention is to provide an improved modular printed circuit assembly with improved locking means for engaging and disengaging the individual printed circuit boards from within the assembly.

Another object of the invention is to provide an improved printed circuit board which is self-locking with respect to the modular unit, simply by sliding the board between guide rails provided for that purpose.

Another object of the invention is to provide an improved camming lever type assembly for quickly and positively disengaging a printed circuit board from the frame in which it is received.

Another object of the invention is to provide a printed circuit board with its own test jacks, facilitating continuous monitoring of the circuits without disturbing the engagement between the printed circuit board and the remainder of the assembly.

Other objects and features of the present invention will become apparent to those skilled in the art from the following description, taken in conjunction with the attached sheets of drawings.

In the modular device of the present invention, I provide a frame which has opposed side walls, and electrical connector means extending between the side walls at one end thereof. Guide rails along each of the side walls, to receive a printed circuit board in slidable relation. The electrical receptacle preferably contains two rows of spaced resilient contact elements for each terminal receptable. The printed circuit board has a plurality of conductive strips at one end thereof, spaced in conformity with the spacing of the spaced contacts of the receptacle, the conductive strips being in electrical continuity with various portions of the circuit which is represented by the elements on the printed circuit board. Thus, when the circuit board is received in engagement with the receptacle, the contact elements in the receptacle resiliently clamp against the board to provide for electrical continuity between the conductive strips and the receptacle. Suitable male contact elements can then be inserted into the other end of the receptacle to connect the printed circuit board to the remainder of the circuitry.

The preferred form of the present invention also makes use of a camming lock means at the end of the board opposite from the end which engages the receptacle, the lock means being arranged to engage the side walls of the frame for releasable locking engagement therewith. In an improved version of the present invention, the camming locking means are mechanically coupled together by a lever operating means carried by the board and arranged to operate both the lever means simultaneously, so that withdrawal of the printed circuit board can be made simply through the use of one hand.

Other objects and features of the present invention will become apparent to those skilled in the art from the following description of the attached sheets of drawings in which.

As shown in the drawings.

Figure 1:
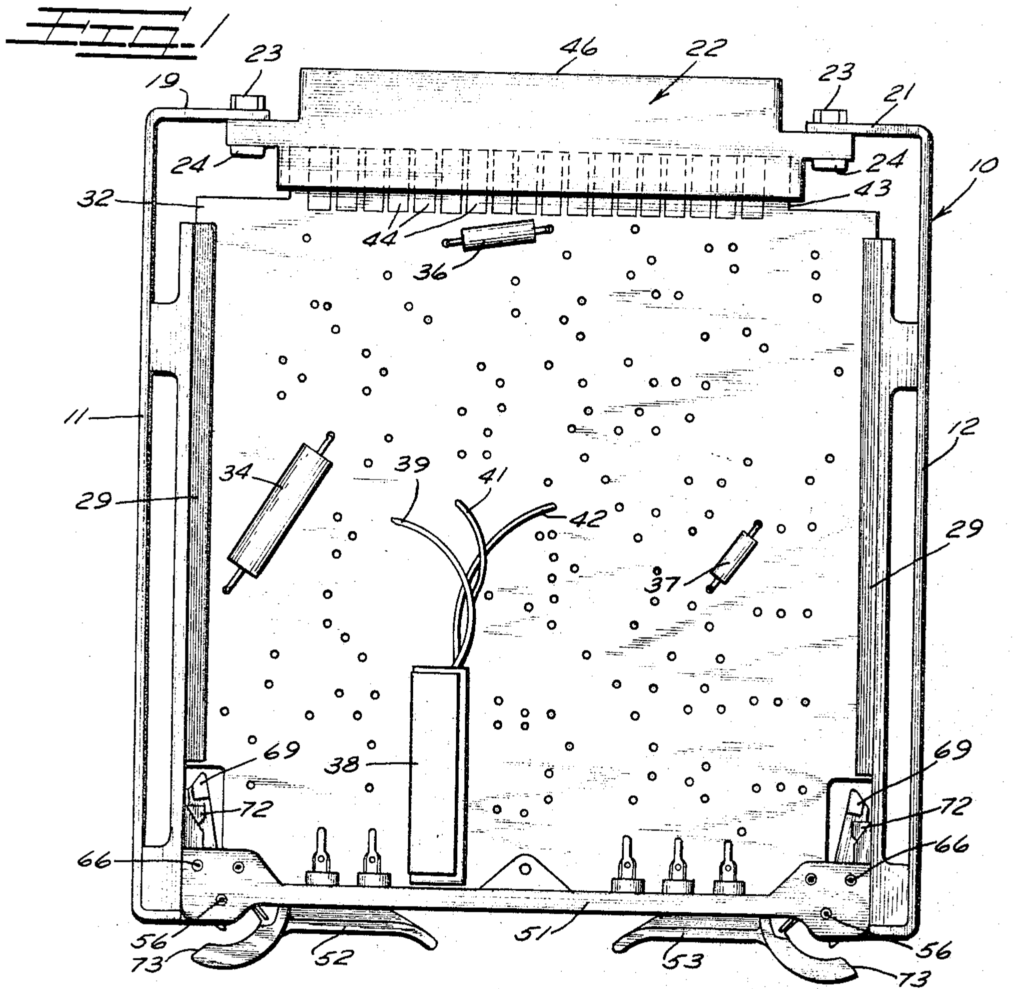
FIGURE 1 is a plan view of the modular unit of the present invention with a printed circuit board received in locked relation therein.

In FIGURE 1, reference numeral 10 indicates generally a modular unit of the type with which the present invention is concerned. The modular unit 10 includes a frame consisting of opposite side walls 11 and 12 having inwardly turned marginal flange portions 13 and 14 respectively, the marginal flange portions 13 and 14 being secured to a base 16 by means of suitable securing means such as nuts 17 and bolts 18.

Figure 2:
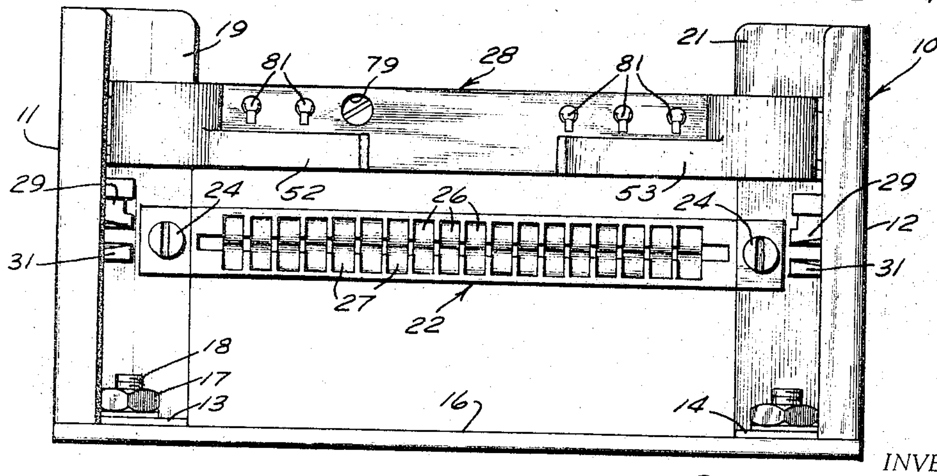
FIGURE 2 is a front elevational view of the assembly shown in FIGURE 1.
Figure 3:
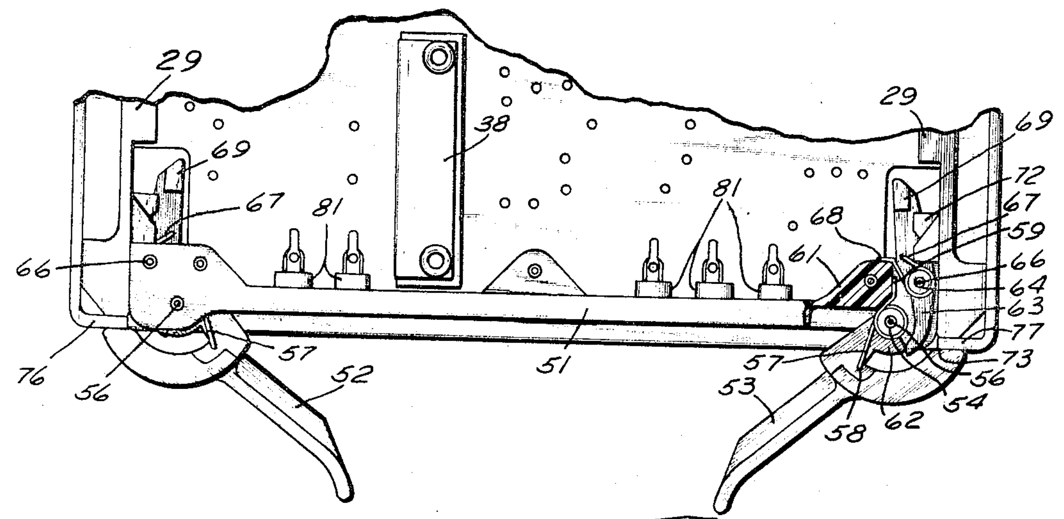
FIGURE 3 is a fragmentary view of the locking means showing an intermediate position thereof during release of the printed circuit board from the frame.

At the rear end of the frame, the opposed side walls 11 and 12 are formed with confronting marginal flange portions 19 and 21 between which there is secured a plurality of electrical receptacles 22, as best illustrated in FIGURE 2 of the drawings. The receptacles 22 are secured to the flanges 19 and 21 by means of securing means such as nuts 23 and bolts 24. As best seen in FIGURE 2, each of the receptacles 22 includes a plurality of resilient spaced electrical contact means in two rows, consisting of resilient contact elements 26 in the upper row, and resilient contact elements 27 in the lower row. As indicated, the contact elements in one row are in direct vertical alignment with the corresponding contact elements in the other row.

Any number of electrical receptacles 22 can be secured to the frame, depending upon the size of the modules. In the particular illustration shown in the drawings, there are two such receptacles 22 and the upper one of the receptacles is shown receiving the improved printed circuit board 28 of the present invention. The side walls 11 and 12 are provided with guide rails 29 and 31 between which a printed circuit board element 32 is arranged to be slidably received. The printed circuit board 32 may be of conventional design, including a plurality of apertures 33 through which electrical leads from electrical circuit elements extend and are interconnected in circuit relationship on the opposite face of the board 32 by the usual printed circuit conductors (not shown). Purely for purposes of illustration, the circuit board 32 is shown as carrying a plurality of resistors 34, 36 and 37 together with a potentiometer 38 from which extend leads 39, 41 and 42. In the usual circuit, of course, there will be a great many more circuit elements carried by the board 32, including elements such as capacitors, vacuum tubes, transistors, or any of the wide variety of electrical circuit elements which can be accommodated on a printed circuit board.

The board 32 is relieved as indicated at reference numeral 43 to provide a tab end portion slidably receivable in clamping engagement with the opposed resilient contact elements 26 and 27. The various electrical circuits involved in the printed circuit board 32 are led out to electrically conductive strips 44 which may be on one or both surfaces of the circuit board 32. The spacing between the strips 44 is the same as the spacing between the resilient contact elements 26 and 27 so that as the tab portion 43 is inserted between the opposed rows of resilient contact elements, the rearward end of the printed circuit board 32 is received in tight clamping engagement between the opposed rows of contact elements 26 and 27, and electrical continuity is provided between the conductive strips 44 and the resilient contact elements 26 and 27. A suitable male contact member (not shown) may then be plugged into the opposite end 46 of the receptacle 22 for connecting the circuit points to other elements of the particular circuit involved.

The printed circuit board 32 is securely held within the frame by an improved type of camming lock means which is best illustrated in FIGURES 1, 3, 4 and 5 of the drawings.

Secured to one end of the circuit board 32 is a nonconductive strip 51 composed of a suitable plastic or the like. Carried by the strip 51 are a pair of levers 52 and 53 which are arranged to pivot in opposite directions with respect to the strip 51. The lever 53 is formed with an integral tubular portion 54 which is received about a roll hinge 56. A torsion spring 57 is trained about the tubular portion 54, and has an end portion 58 secured to the lever 53 and an opposite end portion 59 received against an abutment 61 constituting an extension of the strip 51. The torsion spring 57 normally urges the lever 53 into the position shown in FIGURE 1 of the drawings.

The lever 53 also has integrally formed therewith an internal camming surface 62 which is coplanar with and engages a latch 63. The latch 63 has an integral tubular portion 64 extending therefrom received around a pin 66 for pivotal movement. The latch 63 is urged into engagement with the internal camming surface 62 of the lever 53 by means of a torsion spring 67 trained about the integral post 64. One end portion 68 of the spring 67 is received against the abutment 61 while the other end of the spring 67 is secured to an intermediate portion of the latch 63. The end of the latch 63 is provided with a dog 69, the latter being arranged to fit behind a pair of ears 72 which are coplanar with the guide rails 29 and 31 formed in the side walls of the frame.

The mechanical structure associated with the lever 52 is identical with that associated with the lever 53, except that lever 52 and lever 53 are arranged to pivot in opposite directions. From FIGURE 1, it will be seen that in the locked position of the printed circuit board 32, the dog 69 is received behind the lug 72, thereby preventing extraction of the printed circuit board from its engagement with the receptacle 22. However, when the lever 52 is pivoted in the clockwise direction, and lever 53 is pivoted in the counterclockwise direction, the initial engagement of the internal camming surfaces 62 with the latches 63 causes pivoting of the latches 63 about the pins 66 so that the dogs 69 are moved out from behind the lugs 72, into the position shown in FIGURE 3. In this position, external camming surfaces 73 on the levers 52 and 53 engage confronting marginal flange portions 76 and 77 formed on the side walls 11 and 12 respectively. Continued pivotal movement of the levers about their respective pivot points causes the cam portions 73 to press firmly against the flange portions 76 and 77, thereby providing a mechanical advantage which assists in further withdrawal of the printed circuit board 32 from engagement with the receptacle 22. Such further pivotal movement causes the interior cam surfaces 62 to ride under the latches 63, as best illustrated in FIGURE 4 of the drawings, while holding the dogs 69 in their released position where they are free from the lugs 72.

The plate 51 may include one or more apertures 79 extending therethrough for the purpose of introducing a screwdriver or other adjusting tool to adjust the setting of the potentiometer 38. The strip 51 also carries a plurality of jacks 81 which are connected to portions of the circuit at which periodic or continuous monitoring would be desirable. As shown in FIGURE 2, the jacks 81 are exposed even when the board 32 is locked in position in the frame, so that the monitoring or checking can be carried out without interference from the pivotal levers 52 and 53.

Figures 4, 5, 6, 7:
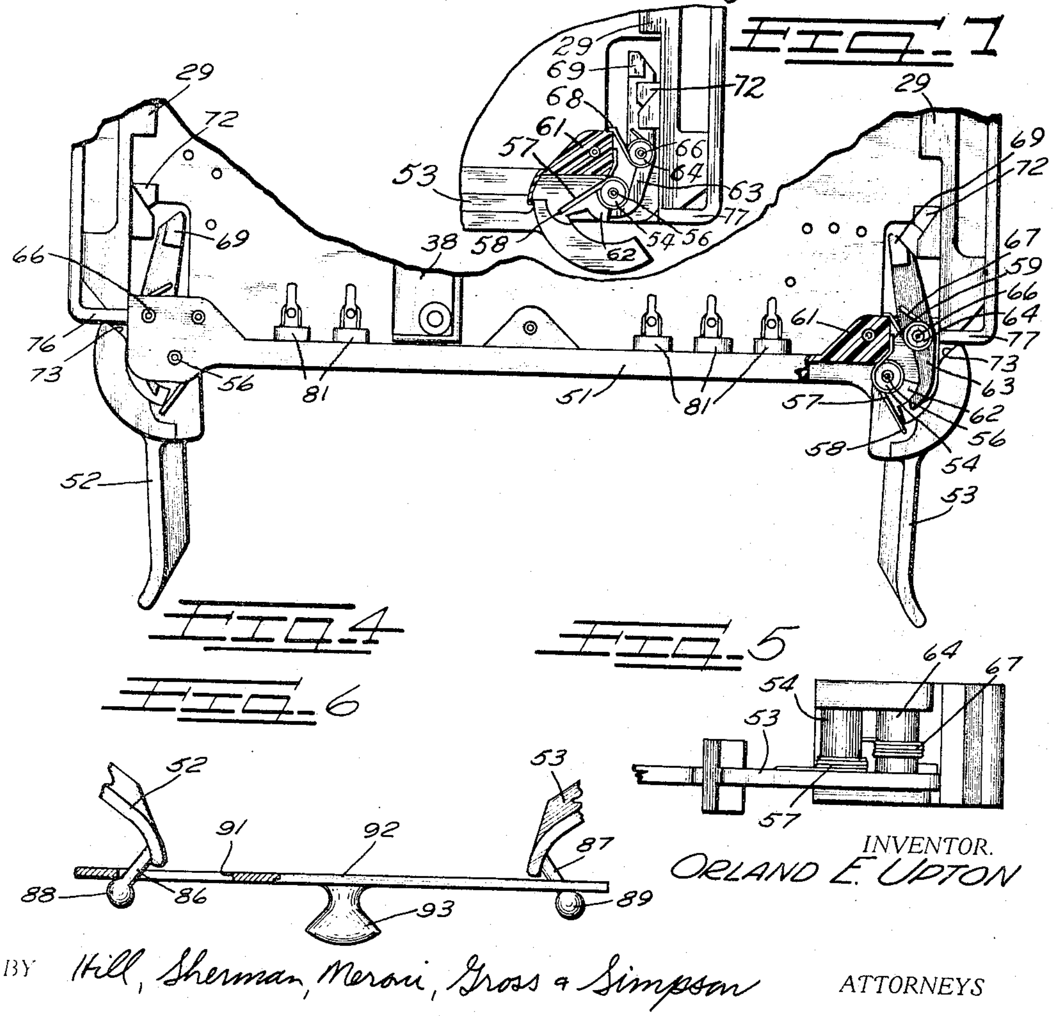
FIGURE 4 is a view similar to FIGURE 3, but illustrating the position of the elements after complete pivoting of the camming levers.
FIGURE 5 is a fragmentary side elevational view of the lever assembly particularly illustrating the spring means associated therewith.
FIGURE 6 is a fragmentary plan view of a modified form of the invention in which a single pull bar interconnects the two camming levers, to enable withdrawal of the printed circuit boards with one hand.
FIGURE 7 is a fragmentary view of the lever assembly and showing the position of the elements in the closed position of FIGURE 1.

The embodiment illustrated in FIGURE 6 makes it possible to operate the two pivotal levers at the same time, with the use of one hand. In the form of the invention shown in FIGURE 6, levers 52 and 53 are each provided with stems 86 and 87 respectively extending therefrom, the stems terminating in relatively large ball portions 88 and 89. Each of the stems is slidably received in slots 91 formed in a pull bar 92 having a handle 93 attached thereto. Each of the slots 91 is of sufficient width to accommodate sliding movement of the stems 86 and 87 therein, but sufficiently narrow to prevent withdrawal of the ball portions 88 and 89 therethrough. Pulling on the handle 93 thereupon causes pivoting of the levers 52 and 53 in the opposite directions as previously described, and rapid disengagement of the printed circuit board from the receptacle.

From the foregoing, it will be understood that the device of the present invention provides a quick acting coupling and decoupling means for individual printed circuit boards in a modular arrangement. The locking means provided is positive in operation, so that the individual printed circuit boards are firmly held in engagement with the electrical connectors at all times. Yet, the locking means provide for quick withdrawal of the individual boards from within the assembly when this becomes necessary or desirable. All of these advantages are provided at a minimum of cost and additional space.

It should be evident that various modifications can be made to the described embodiments without departing from the scope of the present invention.

I claim as my invention:

1. For combination with a module frame having a socket connector and spaced parallel guide rails,
   and a printed circuit board slidably insertable in said guide rails for selective connection with said socket connector,
   the improvement of a latching and camming assembly comprising
   an inwardly extending ear forming an abutment surface on each said guide rail and disposed inwardly adjacent the end of each corresponding guide rail,
   mounting means including a roll hinge on each side of said printed circuit board,
   a camming lever pivotally carried by each said roll hinge and having an arm forming a cam surface for engaging the adjoining end of a corresponding guide rail to assist in removing the printed circuit board from said module frame,
   and a latch member on each side of said printed circuit board pivotally mounted on said mounting means and having a dog portion engageable with said abutment surface of a corresponding one of said ears upon insertion of said printed circuit board to lock said printed circuit board in said frame, and means between said camming lever and said latch member operable in response to actuation of said camming lever to move said dog portion from a locking position in engagement with said ear to an unlocked position away from said ear.

2. The combination of claim 1 in which said camming lever and said latch member are each biased to the engaged position of the latch member by spaced torsion springs.

3. The combination of claim 1 in which said camming lever and said latch member have engaging camming surfaces for causing movement of said dog portion from its locked to its unlocked position during pivotal movement of said camming lever.

References Cited

UNITED STATES PATENTS

| | | | |
|---|---|---|---|
| 2,594,748 | 4/1952 | Earl | 339—45 X |
| 2,735,965 | 2/1956 | Balanda | 317—101 |
| 2,976,510 | 3/1961 | Blain | 339—75 X |
| 2,993,187 | 7/1961 | Bisbing et al. | 339—75 X |
| 3,059,206 | 10/1962 | Williams | 339—45 |
| 3,116,101 | 12/1963 | Kikta | 339—17 X |
| 3,150,906 | 9/1964 | Chambon et al. | 339—45 |

MARVIN A. CHAMPION, *Primary Examiner.*

ALFRED S. TRASK, PATRICK A. CLIFFORD, *Examiners.*